United States Patent
Lv

(10) Patent No.: US 10,416,483 B2
(45) Date of Patent: Sep. 17, 2019

(54) TEST CIRCUIT FOR DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xiaowen Lv, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/576,549

(22) PCT Filed: Sep. 11, 2017

(86) PCT No.: PCT/CN2017/101166
§ 371 (c)(1),
(2) Date: Nov. 22, 2017

(87) PCT Pub. No.: WO2019/015056
PCT Pub. Date: Jan. 24, 2019

(65) Prior Publication Data
US 2019/0025619 A1    Jan. 24, 2019

(30) Foreign Application Priority Data
Jul. 19, 2017    (CN) .......................... 2017 1 0592930

(51) Int. Cl.
*G02F 1/13*    (2006.01)
*G02F 1/1362*    (2006.01)
(Continued)

(52) U.S. Cl.
CPC .......... *G02F 1/1309* (2013.01); *G02F 1/1368* (2013.01); *G02F 1/136286* (2013.01);
(Continued)

(58) Field of Classification Search
CPC .................... G06F 3/041; G06F 3/047; G06F 2001/136254; G02F 1/1309;
(Continued)

(56) References Cited

U.S. PATENT DOCUMENTS

2014/0375344 A1    12/2014    Wang
2015/0077681 A1    3/2015    Li
(Continued)

FOREIGN PATENT DOCUMENTS

CN    102692774 A    9/2012
CN    103325327 A    9/2013
(Continued)

*Primary Examiner* — Alexander O Williams
(74) *Attorney, Agent, or Firm* — Hauptman Ham, LLP

(57) ABSTRACT

This disclosure provides a test circuit for a display panel and a display device. The test circuit for the display panel comprises one or more shorting bars, a plurality of signal lines, and a switch circuit connected with the shorting bars and the signal lines. The switch circuit establishes a connection between the signal lines and a corresponding shorting bar when the display panel is tested, and the switch circuit cuts off the connection between the signal lines and the corresponding shorting bar when the display panel is not tested.

15 Claims, 3 Drawing Sheets

(51) Int. Cl.
*G02F 1/1368* (2006.01)
*G09G 3/00* (2006.01)
*H01L 27/12* (2006.01)

(52) U.S. Cl.
CPC ........... *G09G 3/006* (2013.01); *H01L 27/124* (2013.01); *G02F 2001/136254* (2013.01); *G09G 2300/0426* (2013.01); *G09G 2330/12* (2013.01)

(58) Field of Classification Search
CPC . G02F 1/136286; G02F 1/1368; G09G 3/006; G09G 2300/0426
USPC .......................................................... 257/48
See application file for complete search history.

(56) References Cited

U.S. PATENT DOCUMENTS

| | | | |
|---|---|---|---|
| 2016/0125775 A1* | 5/2016 | Lv .......................... | G09G 3/006 345/100 |
| 2016/0246145 A1* | 8/2016 | Du ........................... | G02F 1/13 |
| 2017/0221399 A1* | 8/2017 | Yan ......................... | G09G 3/006 |
| 2018/0157366 A1 | 6/2018 | Du | |
| 2018/0257366 A1* | 9/2018 | Chretien ............... | B41F 19/068 |

FOREIGN PATENT DOCUMENTS

| | | | | |
|---|---|---|---|---|
| CN | 104392685 A | 3/2015 | | |
| CN | 105335003 A | 2/2016 | | |
| CN | 106773388 A | 5/2017 | | |
| WO | 2019/015056 A1 * | 1/2019 | ............ | H01I 27/124 |

\* cited by examiner

TEST CIRCUIT FOR DISPLAY PANEL AND DISPLAY DEVICE

BACKGROUND

1. Field of the Invention

The present disclosure relates to the field of display technology, and more particularly to a test circuit for display panel and a display device.

2. Description of the Prior Art

Thin-film transistor liquid crystal displays (TFT-LCDs) comprise a color filter (CF), a thin-film transistor (TFT) array substrate, and a liquid crystal layer disposed between the CF and the TFT array substrate.

Manufacturing the TFT-LCDs comprise manufacturing the TFT array substrate, manufacturing the CF and assembling of the TFT array substrate and the CF. The TFT-LCDs should be functionally test after the assembling to eliminate unqualified TFT-LCDs.

Shorting bars are used to do light detecting in functional test. The shorting bars should be laser cut after the light detecting making higher costs.

SUMMARY

The present disclosure provides a test circuit for a display panel and a display device to make a lower cost of the display device.

The present disclosure provides a test circuit for a display panel comprising one or more shorting bars, a plurality of signal lines, and a switch circuit connected with the shorting bars and the signal lines;
the switch circuit establishing a connection between the signal lines and a corresponding shorting bar when the display panel is tested;
the switch circuit cutting off the connection between the signal lines and the corresponding shorting bar when the display panel is not tested;
the switch circuit comprising:
a control signal line; and
a plurality of switch transistors, each of the switch transistors comprising a control end coupled to the control signal line, an output end coupled to the corresponding shorting bar, and an input end coupled to the signal line corresponding to the shorting bar;
wherein the switch transistors turn off to cut off the connection between the plurality of signal lines and the shorting bar in response to a first control signal transmitted by the control signal line;
the switch transistors turn on to establish the connection between the plurality of signal lines and the corresponding shorting bar in response to a second control signal transmitted by the control signal line;
wherein the switch transistors comprise a plurality of thin-film transistors or/and a plurality of transistors.

According to a preferred embodiment of the present disclosure, the thin-film transistors turn on in response to a high level signal transmitted by the control signal line, and the thin-film transistors turn off in response to a low level signal transmitted by the control signal line.

According to a preferred embodiment of the present disclosure, the plurality of signal lines comprise a plurality of red (R) pixel signal lines, a plurality of green (G) pixel signal lines and a plurality of blue (B) pixel signal lines, the plurality of switch transistors comprise a first switch transistor, a second switch transistor and a third switch transistor, and the shorting bars comprise a first shorting bar, a second shorting bar and a third shorting bar;
an input end of the first switch transistor coupled to the plurality of R pixel signal lines, and an output end of the first switch transistor coupled to the first shorting bar;
an input end of the second switch transistor coupled to the plurality of G pixel signal lines, and an output end of the second switch transistor coupled to the second shorting bar;
an input end of the third switch transistor coupled to the plurality of B pixel signal lines, and an output end of the third switch transistor coupled to the third shorting bar.

According to a preferred embodiment of the present disclosure, the plurality of signal lines comprise a plurality of VSS signal lines.

The present disclosure provides a test circuit for a display panel comprising:
one or more shorting bars, a plurality of signal lines, and a switch circuit connected with the shorting bars and the signal lines;
the switch circuit establishing a connection between the signal lines and a corresponding shorting bar when the display panel is tested;
the switch circuit cutting off the connection between the signal lines and the corresponding shorting bar when the display panel is not tested.

According to a preferred embodiment of the present disclosure, the switch circuit comprising a control signal line; and
a plurality of switch transistors, each of the switch transistors comprising a control end coupled to the control signal line, an output end coupled to the corresponding shorting bar, and an input end coupled to the signal line corresponding to the shorting bar;
wherein the switch transistors turn off to cut off the connection between the plurality of signal lines and the shorting bar in response to a first control signal transmitted by the control signal line;
The switch transistors turn on to establish the connection between the plurality of signal lines and the corresponding shorting bar in response to a second signal transmitted by the control signal line.

According to a preferred embodiment of the present disclosure, the switch transistors comprise a plurality of thin-film transistors.

According to a preferred embodiment of the present disclosure, the thin-film transistors turn on in response to a high level signal transmitted by the control signal line, and the thin-film transistors turn off in response to a low level signal transmitted by the control signal line.

According to a preferred embodiment of the present disclosure, wherein switch transistors comprise a plurality of transistors.

According to a preferred embodiment of the present disclosure, the plurality of signal lines comprise a plurality of red (R) pixel signal lines, a plurality of green (G) pixel signal lines and a plurality of blue (B) pixel signal lines, the plurality of switch transistors comprise a first switch transistor, a second switch transistor and a third switch transistor, and the shorting bars comprise a first shorting bar, a second shorting bar and a third shorting bar;
an input end of the first switch transistor coupled to the plurality of R pixel signal lines, and an output end of the first switch transistor coupled to the first shorting bar;

an input end of the second switch transistor coupled to the plurality of G pixel signal lines, and an output end of the second switch transistor coupled to the second shorting bar;

an input end of the third switch transistor coupled to the plurality of B pixel signal lines, and an output end of the third switch transistor coupled to the third shorting bar.

According to a preferred embodiment of the present disclosure, the plurality of signal lines comprise a plurality of VSS signal lines.

The present disclosure provides a display device comprising:

a display panel and a test circuit for the display panel;

the test circuit comprises one or more shorting bars, a plurality of signal lines, and a switch circuit connected with the shorting bars and the signal lines;

the switch circuit establishing a connection between the signal lines and a corresponding shorting bar when the display panel is tested;

the switch circuit cutting off the connection between the signal lines and the corresponding shorting bar when the display panel is not tested.

According to a preferred embodiment of the present disclosure, the switch circuit comprising a control signal line; and a plurality of switch transistors, each of the switch transistors comprising a control end coupled to the control signal line, an output end coupled to the corresponding shorting bar, and an input end coupled to the signal line corresponding to the shorting bar;

wherein the switch transistors turn off to cut off the connection between the plurality of signal lines and the shorting bar in response to a first control signal transmitted by the control signal line;

The switch transistors turn on to establish the connection between the plurality of signal lines and the corresponding shorting bar in response to a second signal transmitted by the control signal line.

According to a preferred embodiment of the present disclosure, the switch transistors comprise a plurality of thin-film transistors.

According to a preferred embodiment of the present disclosure, the thin-film transistors turn on in response to a high level signal transmitted by the control signal line, and the thin-film transistors turn off in response to a low level signal transmitted by the control signal line.

According to a preferred embodiment of the present disclosure, switch transistors comprise a plurality of transistors.

According to a preferred embodiment of the present disclosure, the plurality of signal lines comprise a plurality of red (R) pixel signal lines, a plurality of green (G) pixel signal lines and a plurality of blue (B) pixel signal lines, the plurality of switch transistors comprise a first switch transistor, a second switch transistor and a third switch transistor, and the shorting bars comprise a first shorting bar, a second shorting bar and a third shorting bar;

an input end of the first switch transistor coupled to the plurality of R pixel signal lines, and an output end of the first switch transistor coupled to the first shorting bar;

an input end of the second switch transistor coupled to the plurality of G pixel signal lines, and an output end of the second switch transistor coupled to the second shorting bar;

an input end of the third switch transistor coupled to the plurality of B pixel signal lines, and an output end of the third switch transistor coupled to the third shorting bar.

According to a preferred embodiment of the present disclosure, the plurality of signal lines comprise a plurality of VSS signal lines.

The present disclosure disposes the switch circuit between the shorting bars and the signal lines, establishing a connection between the signal lines and a corresponding shorting bar upon the display panel is tested, cutting off the connection between the signal lines and the shorting bar when the display panel is not tested, and reducing manufacturing cost of the display device.

Aforementioned contents of the present disclosure will be a better understood with reference to the following description, appended claims and accompanying figures.

DETAILED DESCRIPTION OF THE PREFERRED EMBODIMENTS

The following description of every embodiment with reference to the accompanying drawings is used to exemplify a specific embodiment which may be carried out in the present disclosure. Directional terms mentioned in the present disclosure, such as "top", "bottom", "front", "back", "left", "right", "inside", "outside", "side" etc., are only used with reference to the orientation of the accompanying drawings. Therefore, the used directional terms are intended to illustrate, but not to limit, the present disclosure. In the accompanying drawings, units with similar structures are indicated by the same sign.

Reference throughout the specification to "embodiment" means that a particular feature, structure, or characteristic described in connection with the embodiment is included in at least one embodiment. Thus, appearances of the phrases "embodiment" in places throughout the specification are may be combined in any suitable manner in one or more embodiments. Thus, the particular features, structures, or characteristics illustrated or described in connection with one embodiment may be combined, in whole or in part, with the features structures, or characteristics of one or more other embodiments without limitation. Such modifications and variations are intended to be included within the scope of the present invention.

Figure 1:
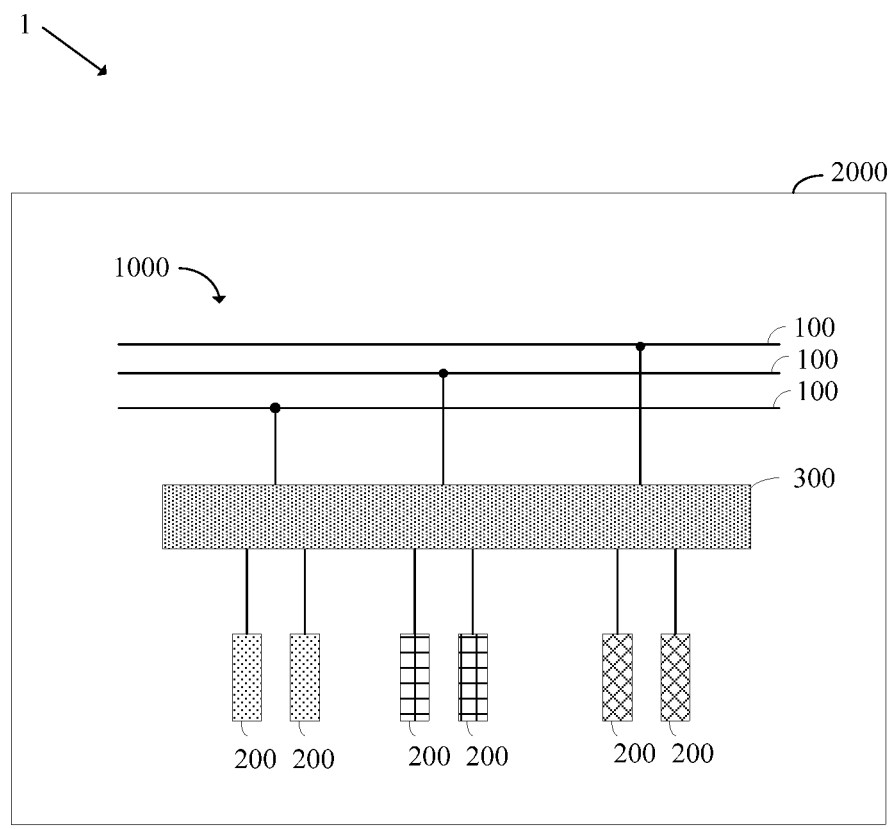
FIG. 1 is a structural schematic diagram of a display device according to the present disclosure.

As shown in FIG. 1, FIG. 1 is a structural schematic diagram of a display device according to the present disclosure. The display device 1 comprises a display panel 2000 and a test circuit for the display panel 1000.

Figure 2:
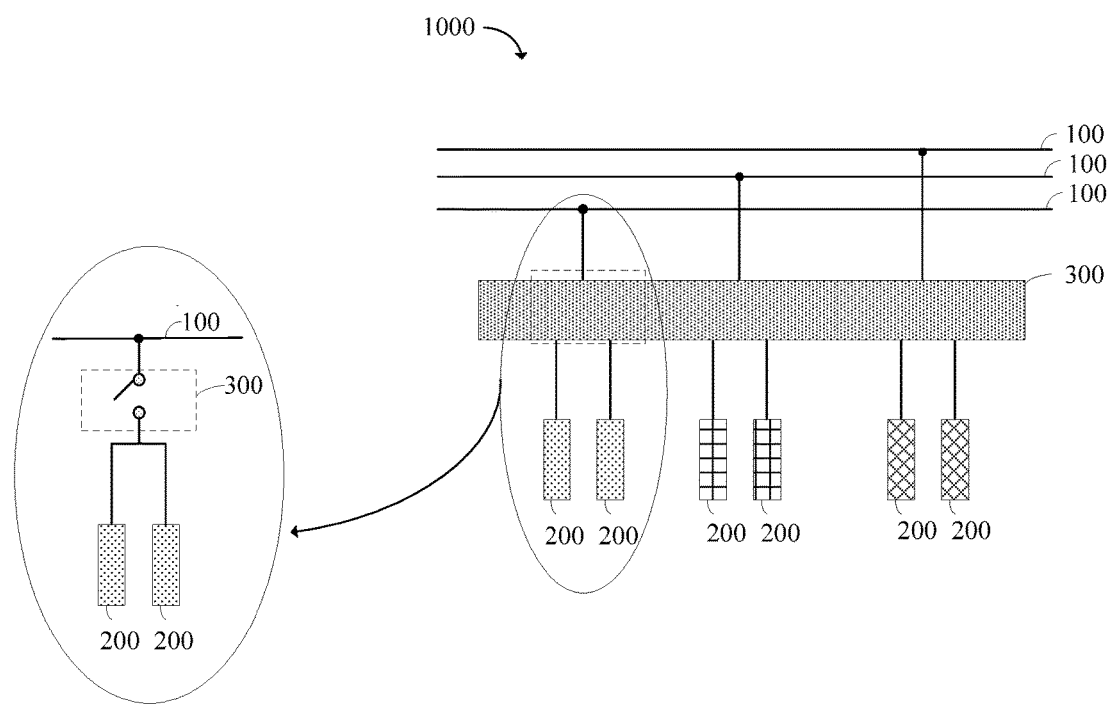
FIG. 2 is a structural schematic diagram of a test circuit for a display panel according to the present disclosure.

As shown in FIG. 2, FIG. 2 is a structural schematic diagram of a test circuit for a display panel according to the present disclosure. The test circuit for the display panel 1000 comprises one or more shorting bars 100, a plurality of signal lines 200, and a switch circuit 300 connected with the shorting bars 100 and the signal lines 200.

In testing the display panel 1000, the switch circuit 300 establishes a connection between the signal lines 200 and a corresponding shorting bar 100, and when the display panel 1000 is not test, the switch circuit 300 cuts off the connection.

As shown in FIG. 2, FIG. 2 shows an ellipse showing the connection between two signal lines 200 and the shorting bar 100. In the broken line frame of FIG. 2, is part of the switch circuit 300. As shown in FIG. 2 enclosed with the broken line frame, a switch is disposed between the signal lines 200 and the shorting bar 100. The display panel 2000 is tested in response to signals transmitted by the two signal lines 200, when the switch is on. The switch is turned off to stop the shorting bar 200 from receiving the signals transmitted by the two signal lines 200 and to protect the display panel 2000 from the signals, when the display panel 2000 is not in test.

Figure 3:
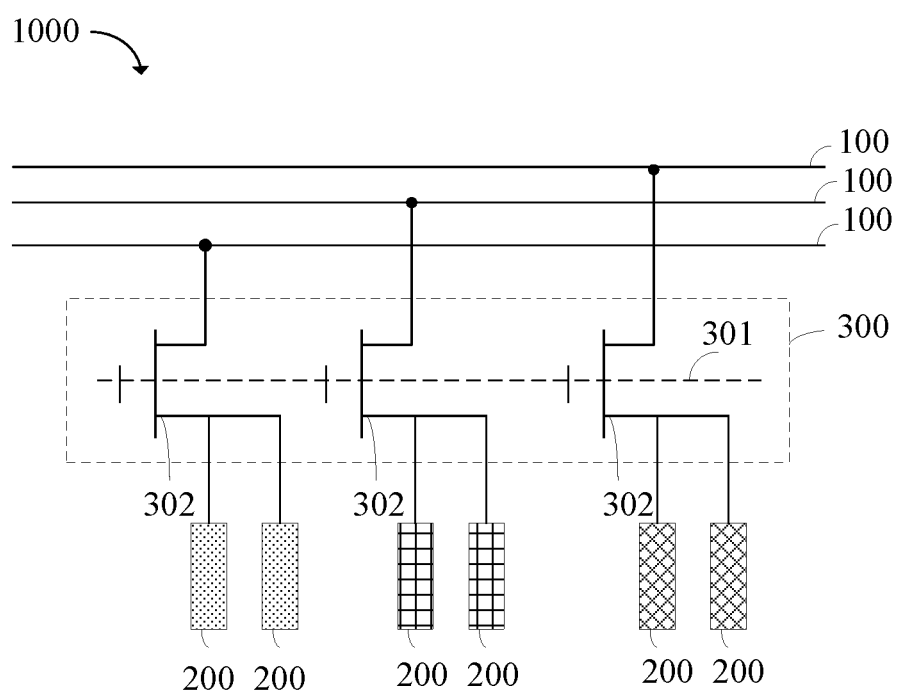
FIG. 3 is another structural schematic diagram of a test circuit for a display panel according to the present disclosure.

According to a preferred embodiment of the present disclosure, as shown in FIG. 3, the switch circuit 300 comprises a control signal line 301 transmitting control signals and a plurality of switch transistors 302. The switch transistor comprises a control end, an input end, and an output end. The switch transistor 302 turns on and off in response to the control signals received by the control end.

As shown in the FIG. 3, the control end of the switch transistor 302 is coupled to the control signal line 301. The output end of the switch transistor 302 is coupled to the corresponding shorting bar 100, and the input end of the switch transistor 302 is coupled to the corresponding signal lines 200.

The switch transistors 302 are turned off in response to a first control signal transmitted by the control signal line 301 to cut off the connection between the signal lines 200 and the corresponding shorting bar 100.

The switch transistors 302 are turned on in response to a second control signal transmitted by the control signal line 301 to establish the connection between the signal lines 200 and the corresponding shorting bar 100.

According to a preferred embodiment of the present disclosure, the switch transistor 302 are a thin-film transistor comprising a gate electrode coupled to the control signal line 301, a source electrode coupled to a plurality of signal lines 200, and a drain electrode coupled to a shorting bar 100. The thin-film transistor is turned on in response to a high level signal transmitted by the control signal line 301 to establish the connection between the plurality of signal lines 200 and the corresponding shorting bar 100, when testing the display panel 2000. The thin-film transistor is turned off in response to a low level signal transmitted by the control signal line 301 to protect the display panel 2000, when the display panel 2000 is not in test.

According to a preferred embodiment of the present disclosure, the switch transistor is a transistor comprising a base coupled to the control signal line 301, a collector coupled to the plurality of signal lines 200, and a emitter coupled to the shorting bar 100.

According to a preferred embodiment of the present disclosure, the plurality of signal lines 200 comprise a plurality of R (red) pixel signal lines, a plurality of G (Green) pixel signal lines and a plurality of B (Blue) pixel signal lines. The plurality of switch transistors 302 comprise a first switch transistor, a second switch transistor and a third switch transistor. The shorting bars 100 comprise a first shorting bar, a second shorting bar and a third shorting bar.

The pixel signal lines are connected to the corresponding shorting bar in response to the second control signal transmitted by the control signal line 301, when testing the display panel 2000. The R pixel lines are connected to the first shorting bar by the first switch transistor. The R pixels in the display panel 2000 are lit in response to a detect signal transmitted by a signal detect point of the first shorting bar to detect abnormal pixels and uneven brightness.

According to a preferred embodiment of the present disclosure, the plurality of signal lines 200 comprise a plurality of VSS signal lines. Connections between the plurality of VSS signal lines, the shorting bars 100 and the switch transistors 302 are refer to the connections between the pixel signal lines, the switch transistors 302 and the shorting bars 100 and is not described here again.

The present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. A test circuit for a display panel comprising:
   one or more shorting bars, a plurality of signal lines, and a switch circuit connected with the shorting bars and the signal lines;
   the switch circuit establishing a connection between the signal lines and a corresponding shorting bar when the display panel is tested;
   the switch circuit cutting off the connection between the signal lines and the corresponding shorting bar when the display panel is not tested;
   the switch circuit comprising:
      a control signal line; and
      a plurality of switch transistors, each of the switch transistors comprising a control end coupled to the control signal line, an output end coupled to the corresponding shorting bar, and an input end coupled to the signal line corresponding to the shorting bar;
   wherein the switch transistors turn off to cut off the connection between the plurality of signal lines and the shorting bar in response to a first control signal transmitted by the control signal line;
   the switch transistors turn on to establish the connection between the plurality of signal lines and the corresponding shorting bar in response to a second control signal transmitted by the control signal line;
   wherein the switch transistors comprise a plurality of thin-film transistors or/and a plurality of transistors;
   wherein the plurality of signal lines comprise a plurality of red (R) pixel signal lines, a plurality of green (G) pixel signal lines and a plurality of blue (B) pixel signal lines, the plurality of switch transistors comprise a first switch transistor, a second switch transistor, and a third switch transistor, and the shorting bars comprise a first shorting bar, a second shorting bar, and a third shorting bar;
   an input end of the first switch transistor coupled to the plurality of R pixel signal lines, and an output end of the first switch transistor coupled to the first shorting bar;
   an input end of the second switch transistor coupled to the plurality of G pixel signal lines, and an output end of the second switch transistor coupled to the second shorting bar;
   an input end of the third switch transistor coupled to the plurality of B pixel signal lines, and an output end of the third switch transistor coupled to the third shorting bar.

2. The test circuit for the display panel as claimed in claim 1, wherein the thin-film transistors turn on in response to a high level signal transmitted by the control signal line, and the thin-film transistors turn off in response to a low level signal transmitted by the control signal line.

3. The test circuit for the display panel as claimed in claim 1, wherein the plurality of signal lines comprise a plurality of VSS signal lines.

4. A test circuit for a display panel comprising:
one or more shorting bars, a plurality of signal lines, and a switch circuit connected with the shorting bars and the signal lines;
the switch circuit establishing a connection between the signal lines and a corresponding shorting bar when the display panel is tested;
the switch circuit cutting off the connection between the signal lines and the corresponding shorting bar when the display panel is not tested;
wherein the plurality of signal lines comprise a plurality of red (R) pixel signal lines, a plurality of green (G) pixel signal lines, and a plurality of blue (B) pixel signal lines, the switch circuit comprises a plurality of switch transistors, the plurality of switch transistors comprise a first switch transistor, a second switch transistor, and a third switch transistor, and the shorting bars comprise a first shorting bar, a second shorting bar, and a third shorting bar;
an input end of the first switch transistor coupled to the plurality of R pixel signal lines, and an output end of the first switch transistor coupled to the first shorting bar;
an input end of the second switch transistor coupled to the plurality of G pixel signal lines, and an output end of the second switch transistor coupled to the second shorting bar;
an input end of the third switch transistor coupled to the plurality of B pixel signal lines, and an output end of the third switch transistor coupled to the third shorting bar.

5. The test circuit for the display panel as claimed in claim 4, wherein the switch circuit comprising a control signal line; and
a plurality of switch transistors, each of the switch transistors comprising a control end coupled to the control signal line, an output end coupled to the corresponding shorting bar, and an input end coupled to the signal line corresponding to the shorting bar;
wherein the switch transistors turn off to cut off the connection between the plurality of signal lines and the shorting bar in response to a first control signal transmitted by the control signal line;
the switch transistors turn on to establish the connection between the plurality of signal lines and the corresponding shorting bar in response to a second signal transmitted by the control signal line.

6. The test circuit for the display panel as claimed in claim 5, wherein the switch transistors comprise a plurality of thin-film transistors.

7. The test circuit for the display panel as claimed in claim 6, wherein the thin-film transistors turn on in response to a high level signal transmitted by the control signal line, and the thin-film transistors turn off in response to a low level signal transmitted by the control signal line.

8. The test circuit for the display panel as claimed in claim 5, wherein switch transistors comprise a plurality of transistors.

9. The test circuit for the display panel as claimed in claim 4, wherein the plurality of signal lines comprise a plurality of VSS signal lines.

10. A display device comprising:
a display panel and a test circuit for the display panel;
the test circuit comprises one or more shorting bars, a plurality of signal lines, and a switch circuit connected with the shorting bars and the signal lines;
the switch circuit establishing a connection between the signal lines and a corresponding shorting bar when the display panel is tested;
the switch circuit cutting off the connection between the signal lines and the corresponding shorting bar when the display panel is not tested;
wherein the plurality of signal lines comprise a plurality of red (R) pixel signal lines, a plurality of green (G) pixel signal lines, and a plurality of blue (B) pixel signal lines, the switch circuit comprises a plurality of switch transistors, the plurality of switch transistors comprise a first switch transistor, a second switch transistor, and a third switch transistor, and the shorting bars comprise a first shorting bar, a second shorting bar, and a third shorting bar;
an input end of the first switch transistor coupled to the plurality of R pixel signal lines, and an output end of the first switch transistor coupled to the first shorting bar;
an input end of the second switch transistor coupled to the plurality of G pixel signal lines, and an output end of the second switch transistor coupled to the second shorting bar;
an input end of the third switch transistor coupled to the plurality of B pixel signal lines, and an output end of the third switch transistor coupled to the third shorting bar.

11. The display device as claimed in claim 10,
wherein the switch circuit comprising a control signal line; and
a plurality of switch transistors, each of the switch transistors comprising a control end coupled to the control signal line, an output end coupled to the corresponding shorting bar, and an input end coupled to the signal line corresponding to the shorting bar;
wherein the switch transistors turn off to cut off the connection between the plurality of signal lines and the shorting bar in response to a first control signal transmitted by the control signal line;
the switch transistors turn on to establish the connection between the plurality of signal lines and the corresponding shorting bar in response to a second signal transmitted by the control signal line.

12. The display device as claimed in claim 11, wherein the switch transistors comprise a plurality of thin-film transistors.

13. The display device as claimed in claim 12, wherein the thin-film transistors turn on in response to a high level signal transmitted by the control signal line, and the thin-film transistors turn off in response to a low level signal transmitted by the control signal line.

14. The display device as claimed in claim 11, wherein switch transistors comprise a plurality of transistors.

15. The display device as claimed in claim 10, wherein the plurality of signal lines comprise a plurality of VSS signal lines.

* * * * *